United States Patent
Dejarld et al.

(10) Patent No.: US 11,682,721 B2
(45) Date of Patent: Jun. 20, 2023

(54) ASYMMETRICALLY ANGLED GATE STRUCTURE AND METHOD FOR MAKING SAME

(71) Applicant: Raytheon Company, Waltham, MA (US)

(72) Inventors: Matthew Thomas Dejarld, Wakefield, MA (US); John P. Bettencourt, Boxford, MA (US); Adam Lyle Moldawer, Tewksbury, MA (US); Kenneth A. Wilson, Salem, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/152,956

(22) Filed: Jan. 20, 2021

(65) Prior Publication Data
US 2022/0231154 A1   Jul. 21, 2022

(51) Int. Cl.
   *H01L 29/778*   (2006.01)
   *H01L 29/40*    (2006.01)
   *H01L 29/423*   (2006.01)
   *H01L 29/66*    (2006.01)
   *H01L 21/285*   (2006.01)

(52) U.S. Cl.
   CPC .... *H01L 29/7786* (2013.01); *H01L 21/28593* (2013.01); *H01L 29/401* (2013.01); *H01L 29/42376* (2013.01); *H01L 29/66431* (2013.01); *H01L 29/66462* (2013.01)

(58) Field of Classification Search
   CPC ......... H01L 21/28114; H01L 29/42376; H01L 29/66462; H01L 29/778–7786; H01L 29/7789
   See application file for complete search history.

(56) References Cited

U.S. PATENT DOCUMENTS

| 4,755,479 A | 7/1988 | Miura |
| 6,524,937 B1 | 2/2003 | Cheng et al. |

(Continued)

FOREIGN PATENT DOCUMENTS

| CN | 111653614 A | 9/2020 |
| EP | 0801418 A | 10/1997 |

(Continued)

OTHER PUBLICATIONS

International Search Report and Written Opinion dated Apr. 26, 2022 for PCT/US2022/012682.

(Continued)

*Primary Examiner* — Yu Chen
(74) *Attorney, Agent, or Firm* — Bachman & LaPointe, P.C.

(57) ABSTRACT

A high electron mobility transistor (HEMT) includes a substrate; a source on the substrate; a drain on the substrate spaced from the source; and a gate between the source and the drain, wherein the gate has a stem contacting the substrate, the stem having a source side surface and a drain side surface, wherein a source side angle is defined between the source side surface and an upper planar surface of the substrate and a drain side angle is defined between the drain side surface and the upper planar surface of the substrate, and wherein the source side angle and the drain side angle are asymmetric. Methods for making the HEMT are also disclosed.

13 Claims, 12 Drawing Sheets

(56) References Cited

U.S. PATENT DOCUMENTS

| | | |
|---|---|---|
| 7,662,698 B2 | 2/2010 | Tabatabaie |
| 7,897,446 B2 | 3/2011 | Smorchkova et al. |
| 7,985,689 B2 | 7/2011 | Perozziello et al. |
| 8,557,645 B2 | 10/2013 | Kurahashi et al. |
| 8,598,009 B2 | 12/2013 | Greene et al. |
| 9,419,083 B2 | 8/2016 | Bettencourt et al. |
| 2011/0049526 A1* | 3/2011 | Chu ................. H01L 29/66462 |
| | | 257/E29.089 |
| 2011/0057272 A1 | 3/2011 | Kurahashi et al. |
| 2011/0140172 A1* | 6/2011 | Chu .................... H01L 21/0254 |
| | | 438/106 |
| 2014/0231823 A1 | 8/2014 | Chowdhury et al. |
| 2014/0353720 A1* | 12/2014 | Inoue ................ H01L 29/42376 |
| | | 438/270 |
| 2017/0263724 A1* | 9/2017 | Kodera ................. H01L 29/402 |
| 2021/0091199 A1* | 3/2021 | Zhang ............... H01L 29/42376 |

FOREIGN PATENT DOCUMENTS

| | | |
|---|---|---|
| JP | H05160019 A | 6/1993 |
| JP | H06260509 A | 9/1994 |
| TW | 201438229 A | 10/2014 |

OTHER PUBLICATIONS

Taiwan Office Action dated Nov. 22, 2022 for corresponding application TW111102319.

* cited by examiner

ASYMMETRICALLY ANGLED GATE STRUCTURE AND METHOD FOR MAKING SAME

BACKGROUND OF THE DISCLOSURE

The disclosure relates to high electron mobility transistors (HEMTs) and pseudomorphic high electron mobility transistors (PHEMTs), and to a method for making same.

HEMTs are also known as heterostructure FET (HFET) or modulation-doped FET (MODFET), and are field-effect transistors incorporating a junction between two materials with different band gaps. A commonly used material combination is GaAs with AlGaAs, though a wide variety of other materials can be used, dependent on the application of the device. HEMTs operate at high frequencies, for example up to millimeter wave frequencies, and are used in high-frequency devices such as cell phones, satellite television receivers, voltage converters, and radar equipment, and also find application in satellite receivers, low power amplifiers and in the defense industry.

One aspect of HEMT and PHEMT design is the shape of the gate, which is typically in the form of either a T or a V shaped structure positioned between a source and a drain. Special care is taken in defining gate profile to optimize capacitance and gate resistance based on the particular application. Capacitance can be minimized by having the gate to semiconductor contact as small as possible and by having the region of the gate stem sidewall adjacent to the semiconductor surface perpendicular.

The top of the gate has dimensions, width and height, that impact resistance. However, a perfectly vertical T-gate can produce a large spike in electric field at the gate edge which can be catastrophic to the device.

Conductive metal plates can be implemented in the stem and can smooth out the electric field at the cost of increased capacitance. These conductive metal plates are known as field plates, and can be integrated into the gate stem directly, or as a separate layer entirely.

Attempts have been made to integrate a slanted field plate into the gate stem directly. However, by nature of known photoresist patterns, the slant is symmetrical on each side. This can negatively raise the capacitance on the source side in order to achieve the field plate effect on the drain side.

The present disclosure addresses these concerns.

SUMMARY OF THE DISCLOSURE

A high electron mobility transistor (HEMT) is disclosed and comprises a substrate; a source on the substrate; a drain on the substrate spaced from the source; and a gate between the source and the drain, wherein the gate comprises a stem contacting the substrate, the stem having a source side surface and a drain side surface, wherein a source side angle is defined between the source side surface and an upper planar surface of the substrate and a drain side angle is defined between the drain side surface and the upper planar surface of the substrate, and wherein the source side angle and the drain side angle are asymmetric.

In one non-limiting configuration, the source side surface and the drain side surface are non-linear surfaces.

In another non-limiting configuration, the non-linear surfaces are non-linear from a point of contact with the upper planar surface of the substrate.

In still another non-limiting configuration, the source side surface and the drain side surface are defined by field plates.

In a further non-limiting configuration, the source side angle is greater than the drain side angle.

In a still further non-limiting configuration, the source side angle is between 25 and 90° and the drain side angle is smaller than the source side angle.

In another non-limiting configuration, the source side angle is between 45 and 90°.

In still another non-limiting configuration, the source side angle is between 70 and 90°.

In a further non-limiting configuration, the drain side angle is between 25 and 70°.

In a still further non-limiting configuration, the drain side angle is between 25 and 50°.

In another non-limiting configuration, the gate is a metallic structure formed from one or more metals selected from the group consisting of gold, platinum, nickel and combinations and alloys thereof.

In another non-limiting configuration, a method for making a transistor is provided, comprising the steps of: applying a layer of photoresist to a substrate coated with ohmic material defining a source and a drain; removing portions of the photoresist to define a central space between a first strip of photoresist and a second strip of photoresist, wherein the first strip and the second strip have different widths; reflowing the photoresist to create reflow angles on either side of the central space; and applying a gate metal to the central space.

In a non-limiting configuration, the method further comprises the steps of: applying a further layer of photoresist over the layer of photoresist after the reflowing step; removing a portion of the further layer to expose the central space; applying gate metal to the further layer and the central space; and removing the layer of photoresist and the further layer of photoresist to produce a substrate having the source, the drain and a gate having a stem contacting the substrate, a source side field plate, and a drain side field plate, wherein the source side field plate and the drain side field plate are defined by non-linear surfaces, and wherein a source side angle is defined between the source side field plate and an upper planar surface of the substrate and a drain side angle is defined between the drain side field plate and the upper planar surface of the substrate, and wherein the source side angle and the drain side angle are asymmetric.

In another non-limiting configuration, the removing step comprises removing a central portion of the layer of photoresist to define the central space, removing a source side portion of the layer of photoresist to define a source side strip of photoresist having a first width, and removing a drain side portion of the layer to photoresist to define a drain side strip of photoresist having a second width.

In still another non-limiting configuration, the photoresist is a material selected from the group consisting of polymethyl methacrylate (PMMA), phenol-formaldehyde resin, and combinations thereof.

In a further non-limiting configuration, the reflowing step comprises exposing the layer of photoresist to a temperature of between 100 and 200° C. for a period of time of between 1 and 10 minutes, whereby the photoresist melts and flows to a shape dictated by surface tension of the photoresist.

In a still further non-limiting configuration, a method for making a transistor is provided which comprises the steps of applying a layer of photoresist to a substrate coated with ohmic material defining a source and a drain, and also coated with a dielectric layer; removing portions of the photoresist to define a central space between a first strip of photoresist and a second strip of photoresist, wherein the first strip and the second strip have different widths; reflowing the photoresist to create reflow angles on either side of the central space; etching the dielectric layer through the central space to define a dielectric central space having sides that are at angles defined by the reflow angles; and applying a gate metal to the dielectric central space.

In another non-limiting configuration, the method further comprises the steps of after the reflowing step, applying a further layer of photoresist over the layer of photoresist; and removing a portion of the further layer to expose the central space.

In still another non-limiting configuration, the method further comprises the steps of after the etching step, stripping the further layer of photoresist and the layer of photoresist from the dielectric layer; applying an additional layer of photoresist over the dielectric layer and the dielectric central space; removing a portion of the additional layer of photoresist to expose the dielectric central space; applying gate metal to the additional layer and the dielectric central space; and removing the additional layer gate metal on the additional layer to produce a substrate having the source, the drain and a gate having a stem contacting the substrate, a source side surface of the stem, and a drain side surface of the stem, wherein a source side angle is defined between the source side surface and an upper planar surface of the substrate and a drain side angle is defined between the drain side surface and the upper planar surface of the substrate, and wherein the source side angle and the drain side angle are asymmetric.

In a further non-limiting configuration, the removing step comprises removing a central portion of the layer of photoresist to define the central space, removing a source side portion of the layer of photoresist to define a source side strip of photoresist having a first width, and removing a drain side portion of the layer to photoresist to define a drain side strip of photoresist having a second width.

BRIEF DESCRIPTION OF THE DRAWINGS

A detailed description of one or more embodiments of the disclosure follows, with reference to the attached drawings, wherein.

Like reference numbers and designations in the various drawings indicate like elements.

DETAILED DESCRIPTION

The present disclosure relates to high electron mobility transistors (HEMTs) and pseudomorphic high electron mobility transistors (PHEMTs), and to a method for making same.

Figure 1:
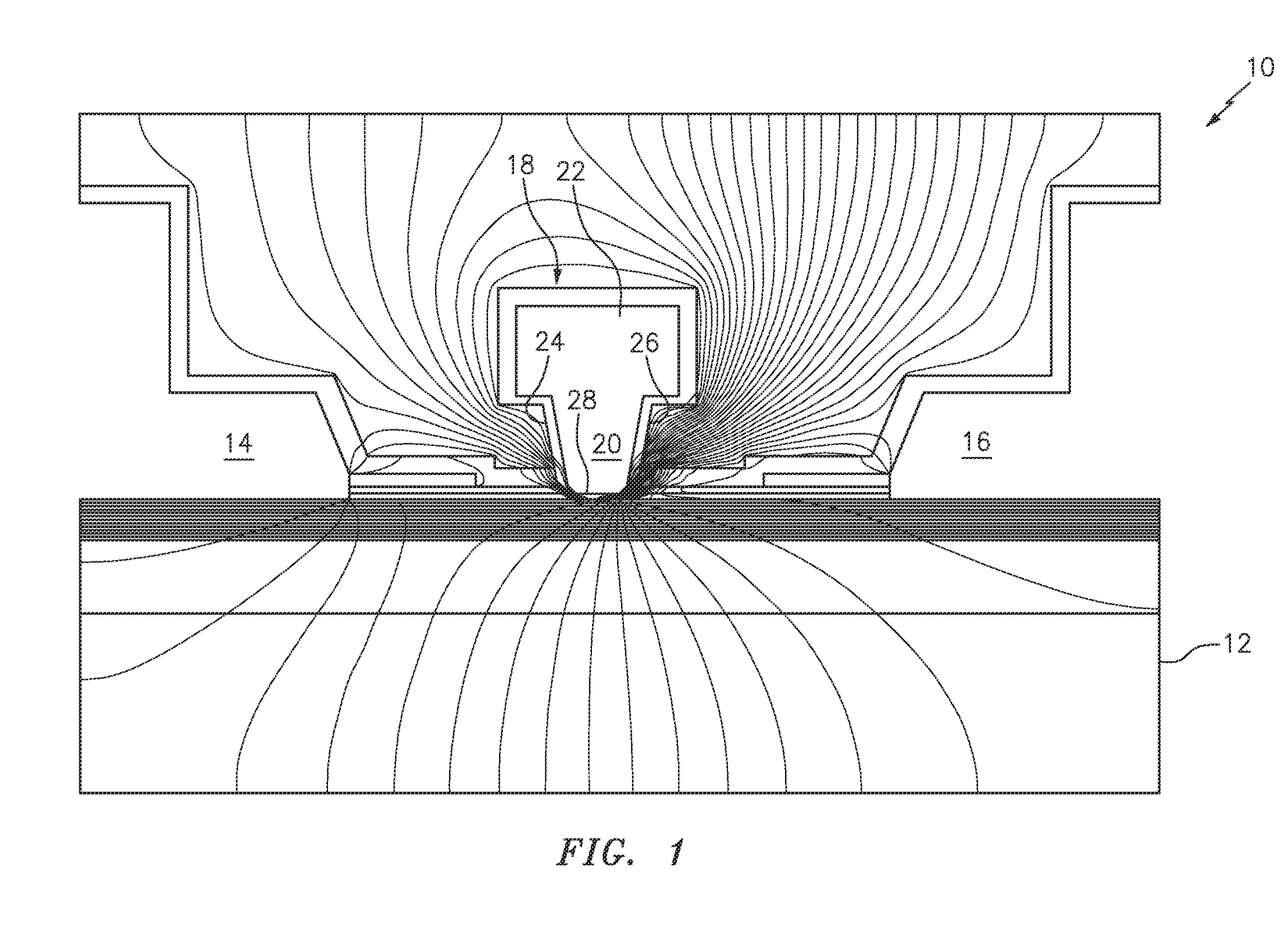
FIG. 1 schematically illustrates components of an HEMT.

FIG. 1 schematically illustrates a PHEMT structure 10 including a substrate 12, a source 14 and a drain 16. Positioned between source 14 and drain 16 is a gate 18 as is well known and understood in the art. Substrate 12 is typically a multilayer structure incorporating a junction between two materials with different band gaps. One non-limiting example of suitable material for substrate 12 is a gallium antimony, or GaAs material. This material can be utilized in different forms, for example in combination with aluminum (AlGaAs), or indium (InGaAs) to produce the desired performance in the junction between the materials. The structure is referred to as pseudomorphic because the hetero layers of material are thin enough not to keep their own crystal lattice structure. Rather, these layers of material assume the structure of surrounding material. The disclosure set forth herein is applicable to both HEMT and PHEMT structures. Further, numerous additional layers can be incorporated into substrate 12 for other related or additional reasons, and all such multiple and additional layer structures are considered to fall within the term "substrate" as used herein.

Source 14 is a layer of ohmic metal. Non-limiting examples of suitable ohmic metals include gold, platinum, nickel, tantalum, tantalum nitride, tungsten, aluminum and their associated alloys.

Drain 16 is also a layer of ohmic metal such as can be the same type of metals as are suitable for the source. Thus, non-limiting examples of suitable ohmic metals include gold, platinum, nickel, tantalum, tantalum nitride, tungsten, aluminum and their associated alloys. The metals can be the same for both source and drain, or can be different.

Gate 18 is shown in FIG. 1 having a conventional T shape, with a narrow stem 20 and a wider top 22. Stem 20 in FIG. 1 has equally and oppositely sloped straight sides 24, 26. The position of sides 24, 26 relative to the substrate surface and to each other impacts the possibility of large spikes in electric field at the gate edge, as well as capacitance across the gate.

Gate 18 has top 22 as shown, with a lateral dimension or width that is greater than width of the stem, and with a vertical dimension or height that is less than the width. The width and height of top 22 impacts resistance in the overall configuration.

A contact point 28 between the bottom surface of stem 20 and the upper surface of substrate 12 is typically preferred to be as small as possible. Further, sides 24, 26 at a point of contact with substrate 12 are typically kept as close as possible to perpendicular. As set forth above, however, a perfectly vertical T shaped gate can result in a large spike in electric field at the gate edge, and this large spike can be catastrophic to the device.

Figure 2:
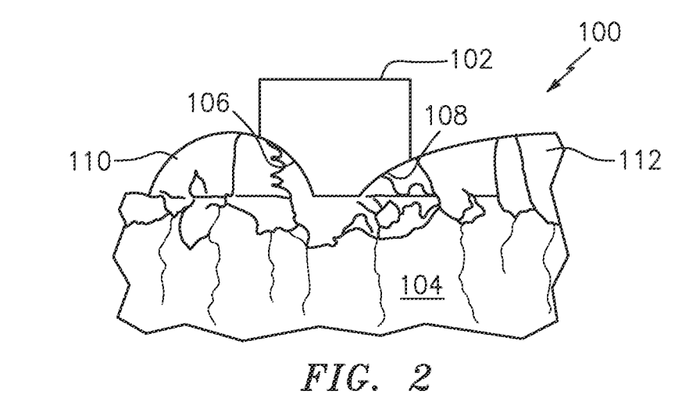
FIG. 2 illustrates a non-limiting configuration of a PHEMT having an asymmetrically angled gate structure.
Figure 3:
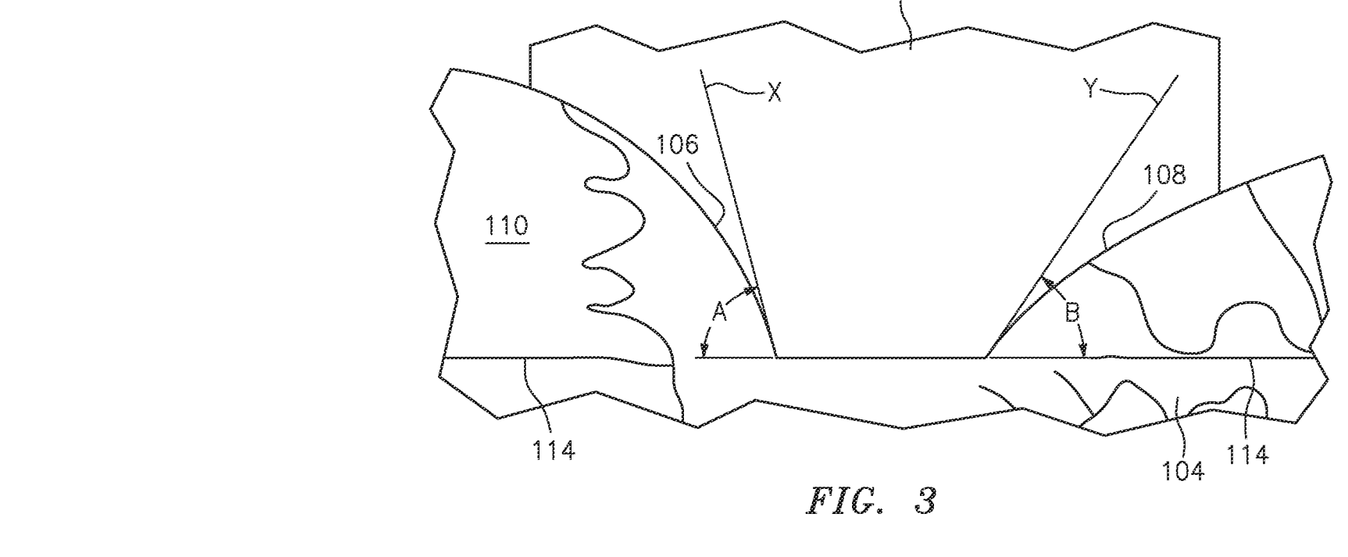
FIG. 3 is an enlarged portion of FIG. 2 to illustrate specific aspects of the disclosure in greater detail.

FIGS. 2 and 3 illustrate a non-limiting configuration of a portion of a PHEMT 100 according to the disclosure. Gate 102 is shown on a substrate 104 and has a source facing side 106 and a drain facing side 108. Sides 106, 108 are non-linear. In the configuration illustrated in FIGS. 2 and 3, sides 106, 108 are curved along an arc.

Sides 106, 108 are asymmetrically positioned relative to substrate 104. In this case, side 106 facing the source is angled closer to perpendicular than side 108 which faces the drain. This allows for side 106 to provide a near-vertical angle on the source side, which reduces capacitance, while side 108 is at a shallower angle on the drain side, which produces smoothing field plate effects, also as desired. This configuration would be difficult to accomplish utilizing conventional manufacturing methods because resist and photoresist materials used to define the space or gap for the gate produce symmetrical slant such as is shown in FIG. 1.

It should be appreciated that FIGS. 2 and 3 show gate 102 with strips of photoresist 110, 112 that are used to form gate 102 according to a method that is further described below. It will further be appreciated that photoresist 110, 112 can be removed after formation of gate 102.

FIG. 3 is an enlarged portion of FIG. 2 and further illustrates specific details of the configuration, shape and angle of sides 106, 108 in one configuration of a gate according to the disclosure. Side 106 in this configuration is non-linear, and specifically is a curved surface that is concave facing generally toward the source. The overall curved surface 106 is at an angle, or is slanted, relative to substrate 104, specifically relative to an upper flat surface 114 of substrate 104. Because sides 106, 108 in this embodiment are formed around curved surfaces of adjacent photoresist, the angle of sides 106, 108 can best be measured as the contact angle of photoresist that defined the shape of the side. Thus, if side 106 is formed by deposition onto photoresist that has a contact angle with surface 114 of 80°, then the angle A of side 106 relative to substrate 104 will be considered to be 80°. Similarly, side 108 is non-linear and in this configuration curved surface that is concave facing generally toward the drain. Side 108 is also formed by deposition onto photoresist that has a contact angle with surface 114 of substrate 104. Thus, the angle B of side 108 is considered to be the contact angle of the photoresist onto which side 108 is deposited. For example, if this photoresist has/had a contact angle of 40°, then angle B of side 108 as referred to herein will be considered to be 40°. Contact angles A, B in the embodiment of FIG. 3 are shown with respect to lines X, Y and surface 114.

In one non-limiting configuration, angle A on the source side is greater than angle B on the drain side. Angle A can be between 25 and 90°. In a further non-limiting configuration, angle A can be between 45 and 90°, and further can be between 70 and 90°. Angle B can also broadly be between 25 and 90°, but in one configuration can be between 25 and 70°, and further can be between 25 and 50°. Within these ranges, again, angle A is greater than angle B. As set forth above, this helps to produce the desired low capacitance while still producing field plate effect on the drain side.

It should be appreciated that while the angles referred to in this embodiment are contact angles, in other configurations the sides 106, 108 may be straight, in which case the angle is simply the angle of the straight side relative to the upper surface of the substrate. Such a configuration is further discussed below. In any of these configurations, the drain side angle B is advantageously less than 90°.

Figure 4:
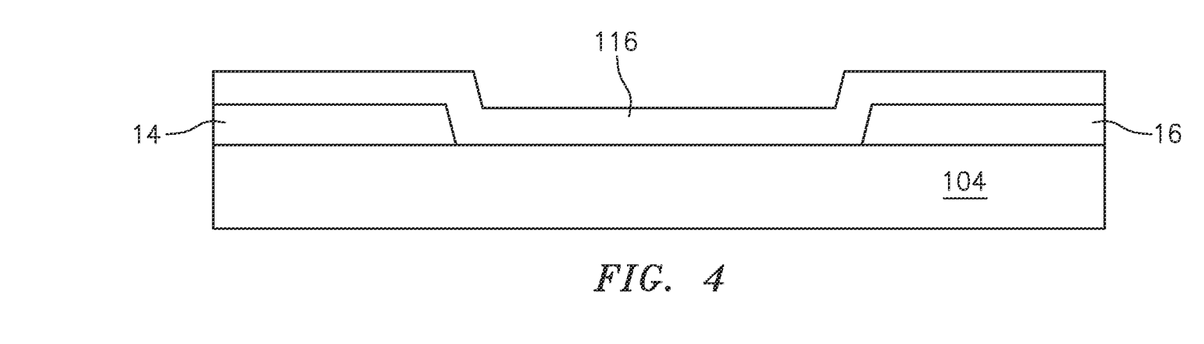
FIGS. 4-10 illustrate a method for making an HEMT.

FIGS. 4-10 illustrate one non-limiting example of a method by which the gate structure illustrated in FIGS. 2 and 3 can be made. FIG. 4 shows a substrate or wafer 104 that has been previously coated with ohmic metal to form what will be source 14 and drain 16. Following known techniques, a layer 116 of resist or photoresist is applied or spin coated over surface 114 of substrate 104, and can also be coated over source 14 and drain 16.

Figure 5:
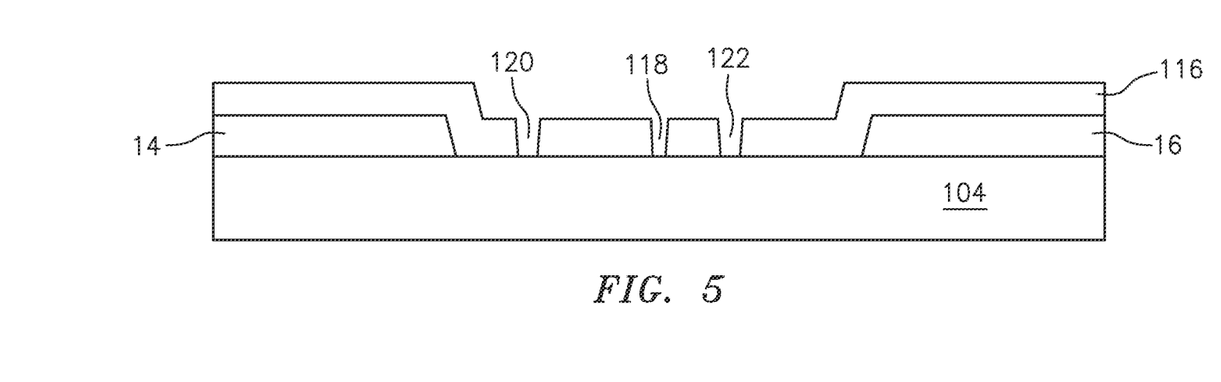

Layer 116 is then exposed and developed to produce a stem channel 118, or central space, and at least two external channels 120, 122. This combination of channels produces strips 110, 112 of photoresist that have different widths. These strips are referred to as assist features, and this configuration is shown in FIG. 5. This step can be accomplished utilizing any known combination of resist or photoresist material and method for removing or etching same. For example, suitable materials for the photoresist can be selected from the group consisting of polymethyl methacrylate (PMMA), phenol-formaldehyde resin, and combinations thereof.

Figure 6:
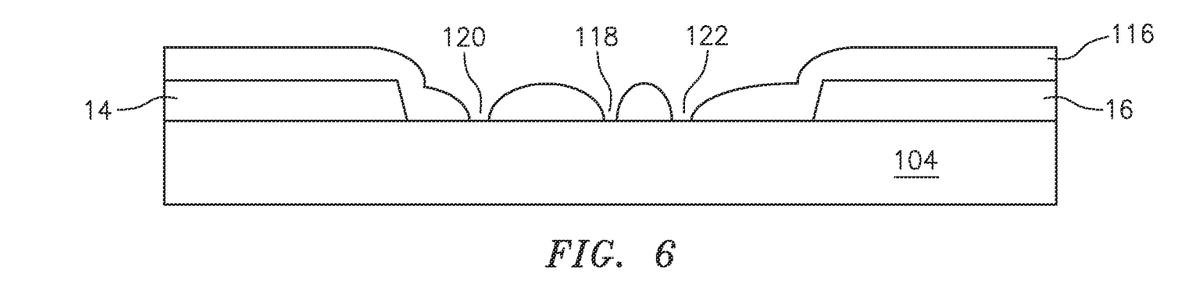

With reference to FIG. 6, the structure of FIG. 5 can be subjected to heat, for example in a photoresist baking step, to reflow the photoresist material and thereby generate the shapes of strips 110, 112 between channels as shown in FIG. 6. The resulting shape of reflowed photoresist depends upon the surface tension of the material and also upon the starting width of the strip of photoresist. This is why the outer channels 120, 122 are formed, as external assist features, as they generate a strip of photoresist on one side that has a different width than on the other side of stem channel 118. A narrower strip of photoresist will produce a steeper contact angle in a gate stem formed in the stem channel, and a wider strip of photoresist will produce a more shallow contact angle in the gate stem formed in this manner. Thus, it can be advantageous to configure a strip 112 of photoresist on the drain side that is wider than the strip 110 of photoresist on the source side.

Figure 7:
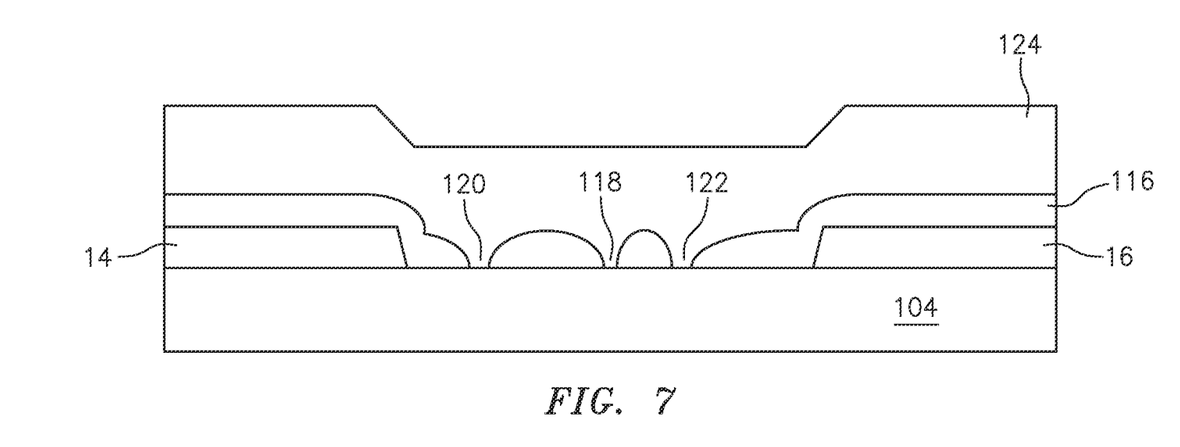
Figure 8:
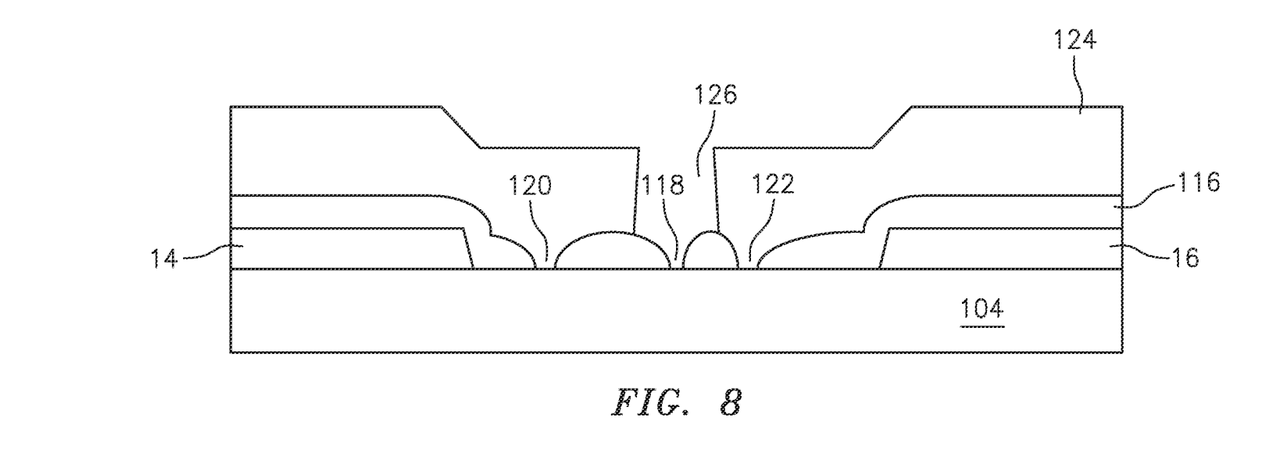
Figure 9:
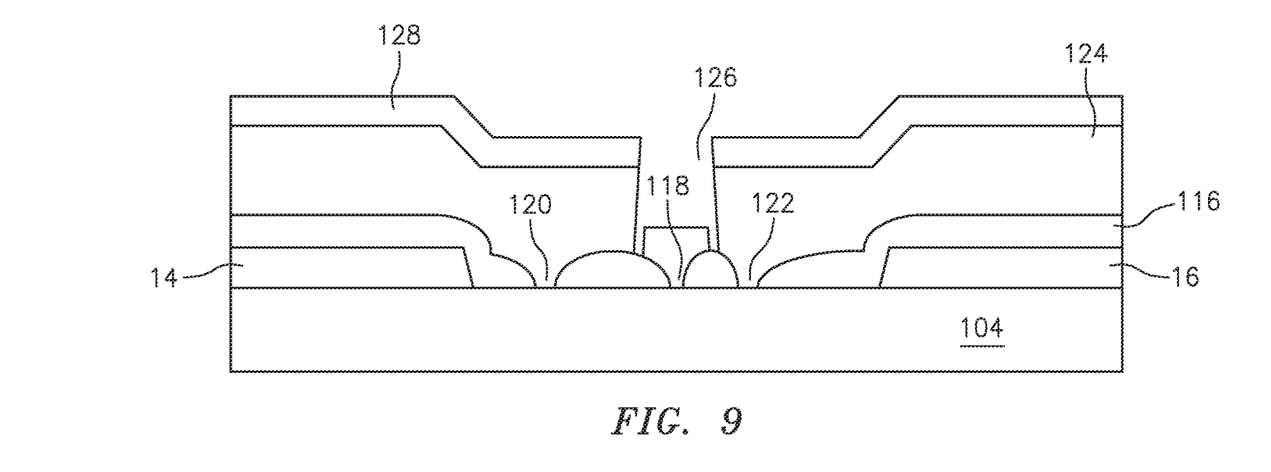

Referring to FIG. 7, a second layer 124 of photoresist can be applied or spin coated over the top of the first layer 116 and into the channels 118, 120, 122. Second layer 124 can be produced from the same photoresist material, or can advantageously be produced from a photoresist that is more sensitive to etching force than the first material. This allows for a portion or channel of second layer 124 to be removed or etched away without removing the underlying first photoresist layer 116, to the extent that this might be desired. As shown in FIG. 8, a channel 126 is formed or etched in layer 124 at a location that exposes the underlying stem channel 118 and portions of the strips of photoresist of layer 116 that surround and define stem channel 118.

Figure 10:
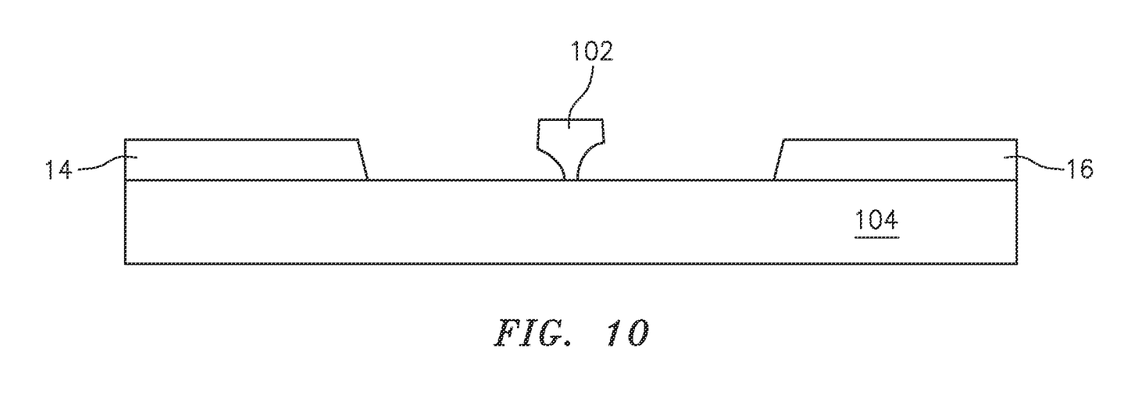

A layer 128 of gate metal can then be deposited over the entire structure, including over layer 124 of photoresist and into stem channel 118, and over surfaces of layer 116 of photoresist that are exposed in channel 126. Alternatively, the gate metal can be deposited only at the location of stem channel 118. This gate metal can be deposited, for example, using vapor deposition, or evaporation, or using any other known technique. Finally, as shown in FIG. 10, excess metal and photoresist of layers 116 and 124 are removed, for example by stripping from wafer or substrate 104, to leave gate 102 with asymmetrically sloped sides as shown. It should be appreciated that in the illustrations of FIGS. 4-10, the steeper angle of gate 102 is shown facing to the right, because a narrower strip of photoresist as assist feature was utilized on that side. Thus, in this configuration, this structure would have source on the right side, and drain on the left.

It should be appreciated that any combination of angles on source and drain side of the stem can be produced following this method by selecting the proper combination of widths of the assist strips on either side of the stem channel.

FIGS. 11-21 illustrate another method for manufacturing a gate for an HEMT where the gate has asymmetrically angled sides.

Figure 11:
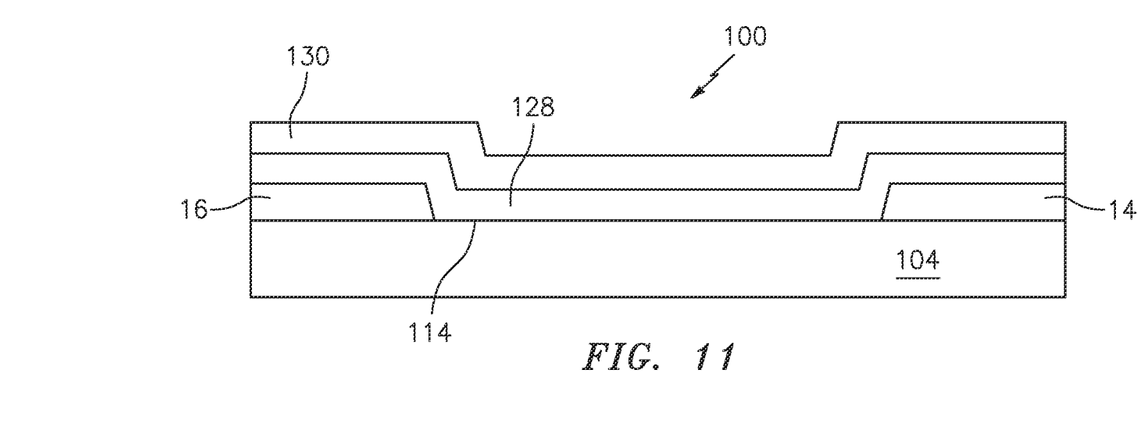
FIGS. 11-21 illustrate a further non-limiting configuration of a method for making an HEMT.

Referring to FIG. 11, a substrate 104 can be provided with ohmic material for source 14 and drain 16, and then coated with a layer 128 of gate dielectric material such as silicon carbide or high k material, for example. Then, a first layer 130 of photoresist can be deposited over dielectric layer 128.

Figure 12:
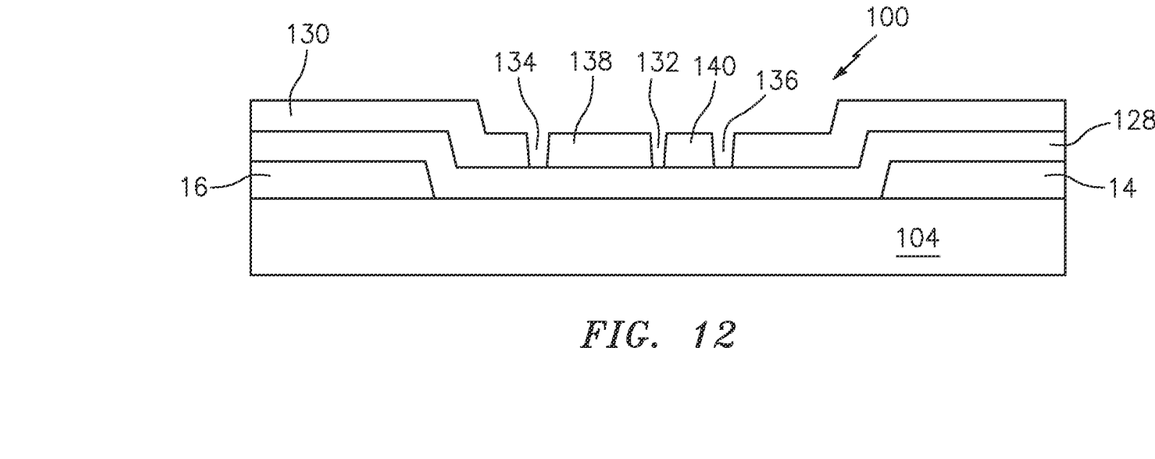

FIG. 12 shows the structure after exposure of photoresist layer 128 to form a stem channel 132 and two spaced external channels 134, 136 on either side of stem channel 132. As with the embodiment of FIGS. 4-10, channels 134, 136 are positioned at different spacing from stem channel 132, such that two strips 138, 140 of photoresist are positioned on either side of stem channel 132, and the two strips 138, 140 are of different width.

Figure 13:
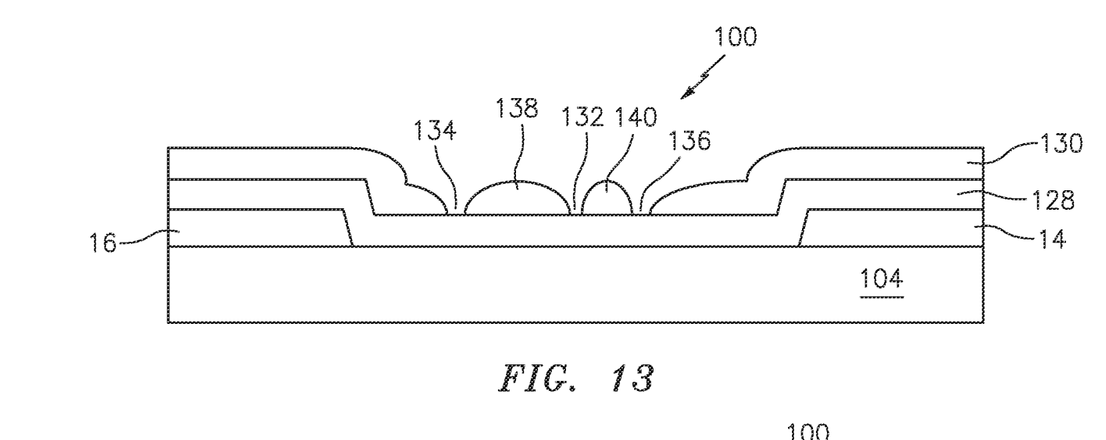

FIG. 13 shows the structure after baking or otherwise reflowing the photoresist such that strips 138, 140 reach their glass transition temperature and reflow to take on a rounded shape that is driven by surface tension and other properties of the material. As shown, the wider strip generates a reflowed shape that has a smaller or more shallow contact angle than the more narrow strip.

Figure 14:
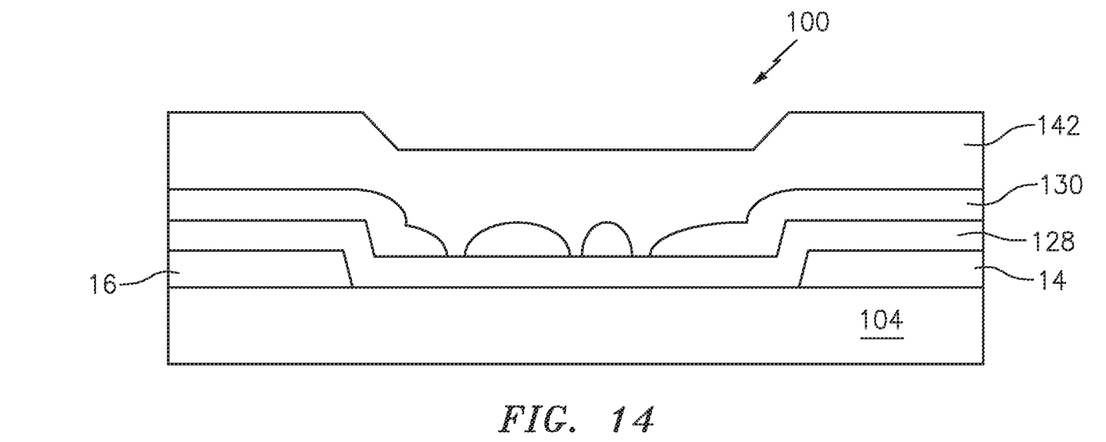
Figure 15:
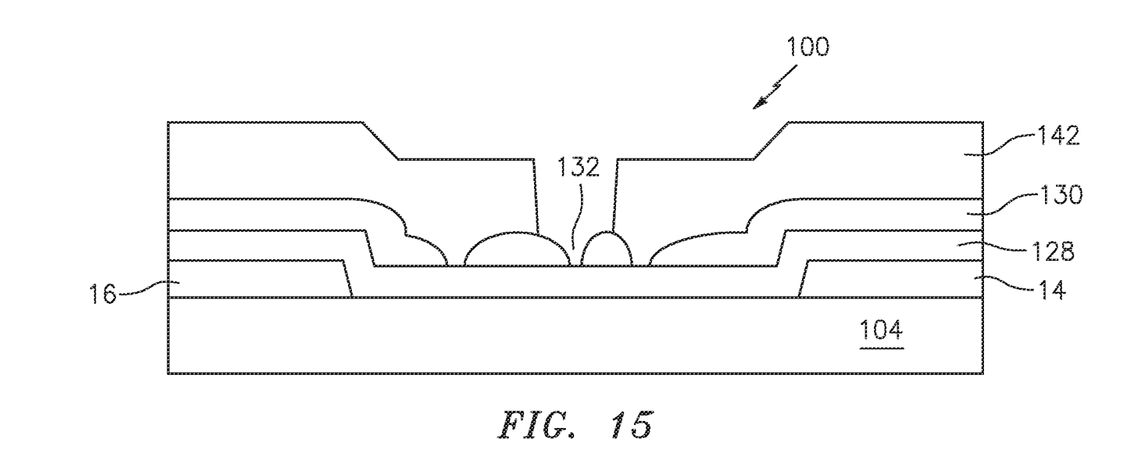

FIG. 14 shows the structure after a second layer 142 of photoresist is applied over the reflowed first layer 130. This second layer 142 can then be exposed or etched away to expose stem channel 132 as shown in FIG. 15.

Figure 16:
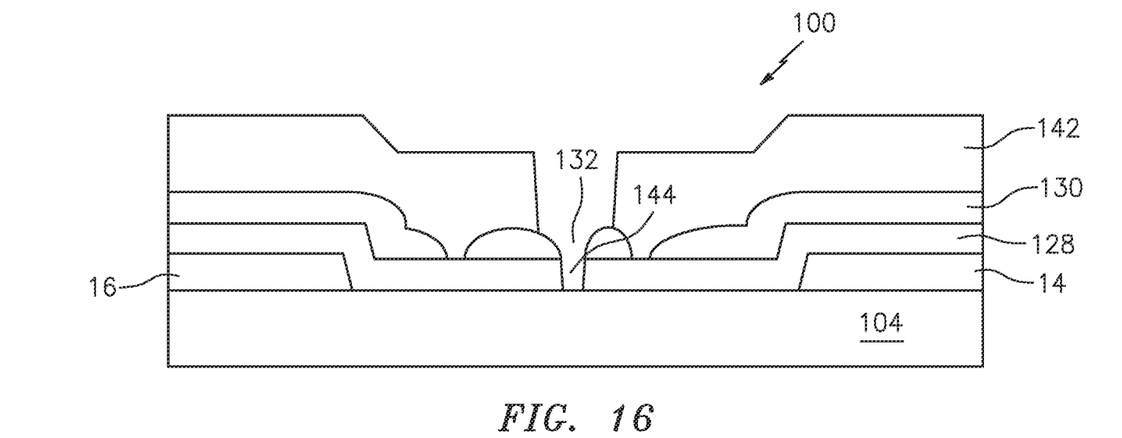

At this stage, dielectric layer 128 can be etched through stem channel 132 to form a central channel 144 in dielectric layer 128. Because this etching is accomplished through a space defined between differently angled walls of strips 138, 140, central channel 144 has sides 146, 148 that are differently angled relative to substrate 104. This is shown in FIG. 16.

Figure 17:
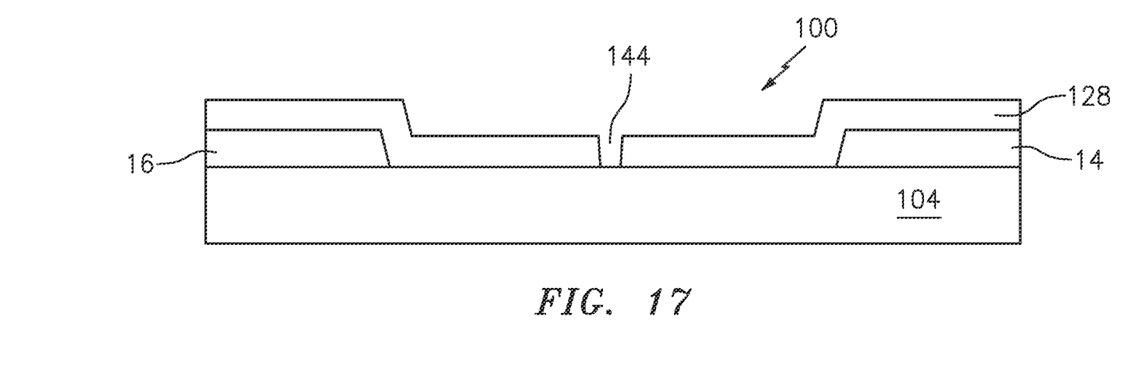
Figure 18:
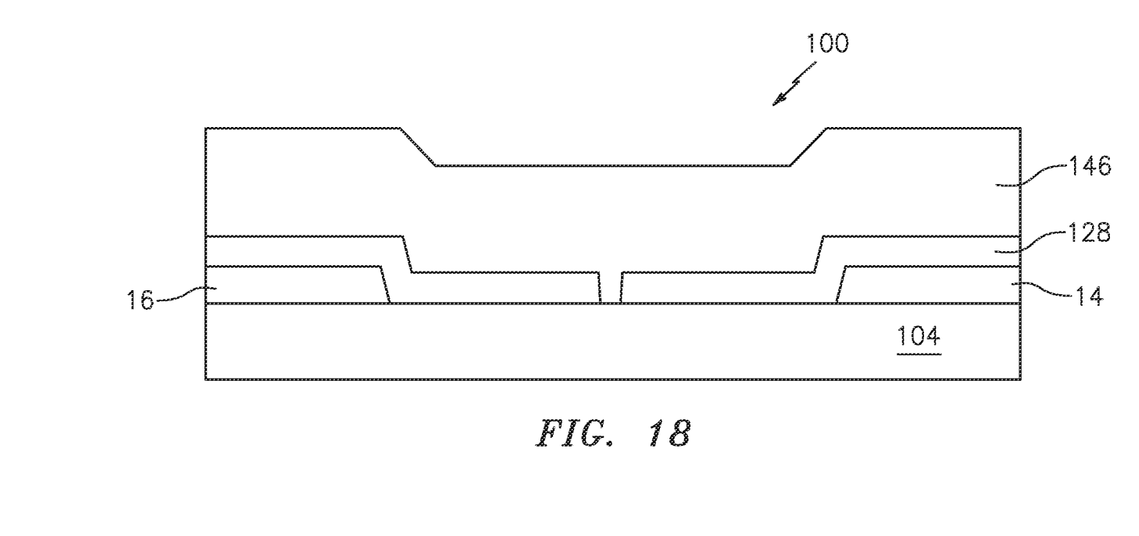
Figure 19:
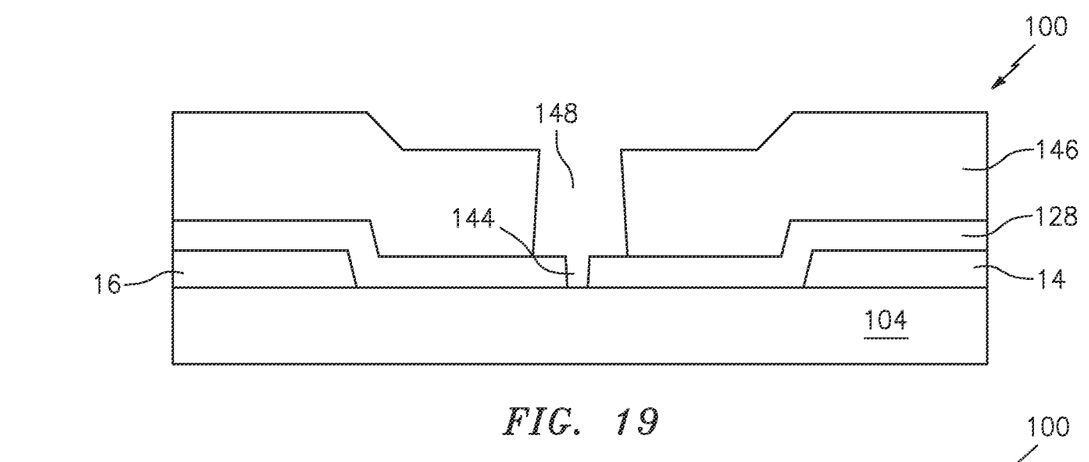
Figure 20:
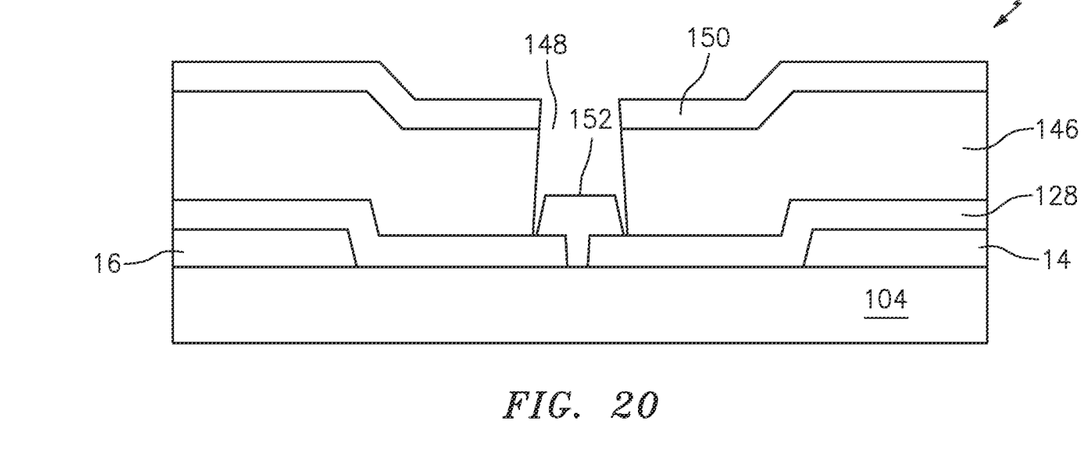
Figure 21:
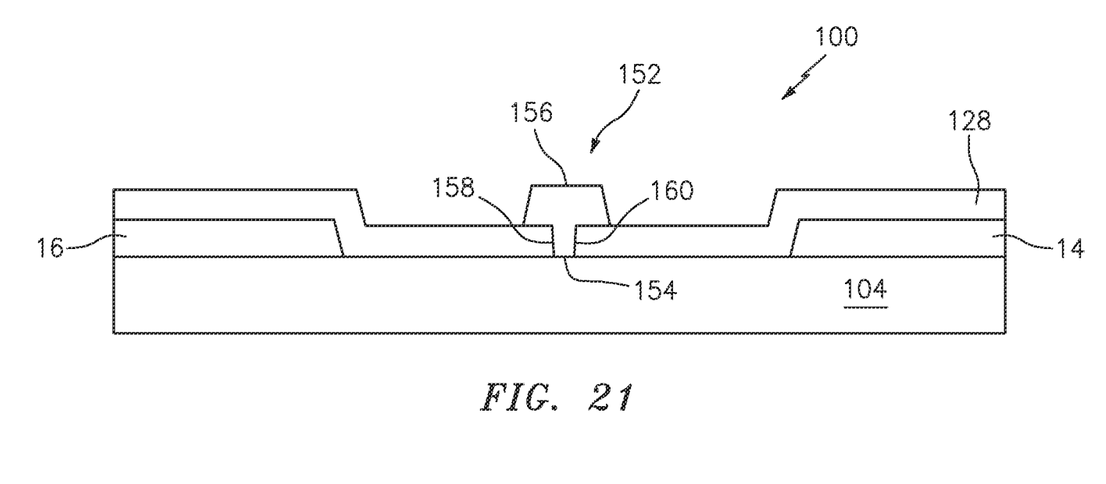

FIG. 17 shows the structure after layers 116, 124 of photoresist are removed, leaving the dielectric with central channel 144. A third layer 146 of photoresist can then be positioned or deposited over dielectric layer 128 and central channel 144 as shown in FIG. 18, and this third layer 146 can then be etched or exposed to form an opening 148 over central channel 144. This exposure or etching can be conducted using a mask technique or any other technique, the result being an opening 148 that is wider than central channel 144. Further, opening 148 can be defined by walls 150, 152 that have a spacing that increases closer to dielectric layer 128 (See FIG. 19). Gate metal 150 can then be deposited over the structure and into opening 148 and central channel 144 as shown in FIG. 20. A gate 152 having the expected shape is shown being formed as a result. Finally, third layer of dielectric 146 as well as excess gate metal 150 can be removed, leaving an HEMT structure 100 as shown in FIG. 21. As can be seen, gate 152 has a stem 154 and top 156 which is wider than stem 154. As with the configuration of FIGS. 2 and 3, stem 154 is defined by sides 158, 160 that are at different angles relative to substrate 104. The different angles of these sides can advantageously be within the ranges for angles A and B as discussed above. However, in this configuration the sides 158, 160 are substantially linear. Further, rather than being defined within the substrate, in this case gate 152 is formed with stem 154 contacted on either side in dielectric layer 128.

One or more embodiments of the present disclosure have been described. Nevertheless, it will be understood that various modifications may be made without departing from the spirit and scope of the invention. For example, different materials and configurations could be utilized, and transistor structures having different shapes or configurations may benefit from this disclosure. Accordingly, other embodiments are within the scope of the following claims.

What is claimed is:

1. A high electron mobility transistor comprising:
a substrate;
a source on the substrate;
a drain on the substrate spaced from the source; and
a gate between the source and the drain, wherein the gate comprises a stem contacting the substrate, the stem having a source side surface and a drain side surface, wherein a source side angle is defined between the source side surface and an upper planar surface of the substrate and a drain side angle is defined between the drain side surface and the upper planar surface of the substrate, wherein the source side angle and the drain side angle are asymmetric, wherein the source side surface is entirely concave toward the source, and the drain side surface is entirely concave toward the drain, wherein the source side surface and the drain side surface are non-linear surfaces and, wherein the non-linear surfaces are non-linear from a point of contact with the upper planar surface of the substrate, and wherein the source side surface terminates at a first point a first distance above the upper planar surface of the substrate and the drain side surface terminates at a second point a second distance above the upper planar surface of the substrate, and wherein the first distance is different from the second distance.

2. The transistor of claim 1, wherein the stem comprises field plates, and wherein the source side surface and the drain side surface are defined by the field plates.

3. The transistor of claim 1, wherein the source side angle is greater than the drain side angle.

4. The transistor of claim 1, wherein the source side angle is between 25 and 90° and the drain side angle is smaller than the source side angle.

5. The transistor of claim 4, wherein the source side angle is between 45 and 90°.

6. The transistor of claim 4, wherein the source side angle is between 70 and 90°.

7. The transistor of claim 4, wherein the drain side angle is between 25 and 70°.

8. The transistor of claim 4, wherein the drain side angle is between 25 and 50°.

9. The transistor of claim 1, wherein the gate is a metallic structure formed from one or more metals selected from the group consisting of gold, platinum, nickel and combinations and alloys thereof.

10. A method for making a transistor, comprising the steps of:
applying a layer of photoresist to a substrate coated with ohmic material defining a source and a drain;
removing portions of the photoresist to define a central space between a first strip of photoresist and a second strip of photoresist, wherein the first strip and the second strip have different widths;
reflowing the photoresist to create reflow angles on either side of the central space;
applying a gate metal to the central space;
removing the layer of photoresist to produce the transistor having the source, the drain and a gate having a stem contacting the substrate, the stem having a source side surface and a drain side surface, wherein the source side surface and the drain side surface are defined by non-linear surfaces, and wherein a source side angle is defined between the source side surface and an upper planar surface of the substrate and a drain side angle is defined between the drain side surface and the upper planar surface of the substrate, and wherein the source side angle and the drain side angle are asymmetric, wherein the source side surface is entirely concave toward the source, and the drain side surface is entirely concave toward the drain, wherein the non-linear surfaces are non-linear from a point of contact with the upper planar surface of the substrate, and wherein the source side surface terminates at a first point a first distance above the upper planar surface of the substrate and the drain side surface terminates at a second point a second distance above the upper planar surface of the substrate, wherein the first distance is different from the second distance.

11. The method of claim 10, wherein the removing step comprises removing a central portion of the layer of photoresist to define the central space, removing a source side portion of the layer of photoresist to define a source side strip of photoresist having a first width, and removing a drain side portion of the layer to photoresist to define a drain side strip of photoresist having a second width.

12. The method of claim 10, wherein the photoresist is a material selected from the group consisting of polymethyl methacrylate (PMMA), phenol-formaldehyde resin, and combinations thereof.

13. The method of claim 10, wherein the reflowing step comprises exposing the layer of photoresist to a temperature of between 100 and 200° C. for a period of time of between 1 and 10 minutes, whereby the photoresist melts and flows to a shape dictated by surface tension of the photoresist.

* * * * *